United States Patent
Ono et al.

(10) Patent No.: US 6,847,252 B1
(45) Date of Patent: *Jan. 25, 2005

(54) SEMICONDUCTOR INTEGRATED CIRCUIT DEVICE

(75) Inventors: Goichi Ono, Saitama (JP); Masayuki Miyazaki, Tokyo (JP); Koichiro Ishibashi, Warabi (JP)

(73) Assignee: Renesas Technology Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/671,477

(22) Filed: Sep. 29, 2003

Related U.S. Application Data

(63) Continuation of application No. 10/284,207, filed on Oct. 31, 2002, now Pat. No. 6,653,890.

(30) Foreign Application Priority Data

Nov. 1, 2001 (JP) ........................................ 2001-336208

(51) Int. Cl.[7] .................................................. G05F 1/46
(52) U.S. Cl. ....................................................... 327/537
(58) Field of Search ................................. 327/534, 535, 327/537, 538, 541, 543, 262, 270, 276

(56) References Cited

U.S. PATENT DOCUMENTS

| 5,874,851 A | * | 2/1999 | Shiota ......................... 327/537 |
| 5,883,544 A | | 3/1999 | So et al. ...................... 327/537 |
| 6,232,793 B1 | * | 5/2001 | Arimoto et al. ............... 326/34 |
| 6,466,077 B1 | | 10/2002 | Miyazaki et al. ........... 327/534 |
| 6,518,825 B2 | | 2/2003 | Miyazaki et al. ........... 327/534 |
| 6,559,708 B2 | * | 5/2003 | Notani ......................... 327/537 |
| 2001/0048319 A1 | | 12/2001 | Miyazaki et al. .............. 326/1 |

FOREIGN PATENT DOCUMENTS

JP 2001-156261 A 4/2000

* cited by examiner

*Primary Examiner*—Timothy P. Callahan
*Assistant Examiner*—Terry L. Englund
(74) *Attorney, Agent, or Firm*—Reed Smith LLP; Stanley P. Fisher, Esq.; Juan Carlos A. Marquez, Esq.

(57) ABSTRACT

A semiconductor integrated circuit device having a mechanism of compensating not only circuit operational speed but also variations in leakage current, which includes: a main circuit constructed with CMOS device, a delay monitor for simulating a critical path of the main circuit constructed by a CMOS and monitoring a delay of the path, a PN Vt balance compensation circuit for detecting a threshold voltage difference between a PMOS transistor and an NMOS transistor, and a well bias generating circuit for receiving outputs of the delay monitor and the PN Vt balance compensation circuit and applying a well bias to the delay monitor and the main circuit so as to compensate the operation speed of the delay monitor to a desired speed and reduce a threshold voltage difference between the PMOS and NMOS transistors.

14 Claims, 16 Drawing Sheets

FIG.16

| diff | adrp | adrn |
|------|------|------|
|      | ---- | ---- |
|      | 9    | 9    |
|      | 8    | 9    |
|      | 7    | 9    |
|      | 6    | 8    |
| -3   | 5    | 7    |
|      | 4    | 6    |
|      | 3    | 5    |
|      | 2    | 4    |
|      | 1    | 3    |
|      | 0    | 2    |
|      | 9    | 9    |
|      | 8    | 9    |
|      | 7    | 8    |
|      | 6    | 7    |
| -2   | 5    | 6    |
|      | 4    | 5    |
|      | 3    | 4    |
|      | 2    | 3    |
|      | 1    | 2    |
|      | 0    | 1    |
|      | 9    | 9    |
|      | 8    | 8    |
|      | 7    | 7    |
|      | 6    | 6    |
| -1   | 5    | 5    |
|      | 4    | 4    |
|      | 3    | 3    |
|      | 2    | 2    |
|      | 1    | 1    |
|      | 0    | 0    |

| diff | adrp | adrn |
|------|------|------|
|      | 9    | 8    |
|      | 8    | 7    |
|      | 7    | 6    |
|      | 6    | 5    |
| 0    | 5    | 4    |
|      | 4    | 3    |
|      | 3    | 2    |
|      | 2    | 1    |
|      | 1    | 0    |
|      | 0    | 0    |
|      | 9    | 7    |
|      | 8    | 6    |
|      | 7    | 5    |
|      | 6    | 4    |
| 1    | 5    | 3    |
|      | 4    | 2    |
|      | 3    | 1    |
|      | 2    | 0    |
|      | 1    | 0    |
|      | 0    | 0    |
|      | 9    | 6    |
|      | 8    | 5    |
|      | 7    | 4    |
|      | 6    | 3    |
| 2    | 5    | 2    |
|      | 4    | 1    |
|      | 3    | 0    |
|      | 2    | 0    |
|      | 1    | 0    |
|      | 0    | 0    |
|      | ---- | ---- |

SEMICONDUCTOR INTEGRATED CIRCUIT DEVICE

This application is a Continuation of nonprovisional application Ser. No. 10/284,207 filed Oct. 31, 2002, which was issued into U.S. Pat. No. 6,653,890 on Nov. 25, 2003. Priority is claimed based on U.S. application Ser. No. 10/284,207 filed Oct. 31, 2002, which claims the priority of Japanese application 2001-336208 filed on Nov. 1, 2001.

BACKGROUND OF THE INVENTION

In the second embodiment, in a manner similar to the first embodiment, the delay of the CMOS LSI can be compensated and the threshold voltage difference between the PMOS transistor and the NMOS transistor can be eliminated. In addition, by feeding back the signal vbap to the PN Vt balance compensation circuit 123, even if the threshold voltage difference occurs between the PMOS transistor and the NMOS transistor at the time of changing the signals vbap and vban in order to compensate delay, the difference can be compensated.

SUMMARY OF THE INVENTION

When the performance of a transistor varies according to a fabricating process and a difference occurs between a threshold voltage of a PMOS transistor and a threshold voltage of an NMOS transistor, even if the circuit speed is the same, leakage currents of the circuits may differ from each other. This happens for the reason that the leakage current depends on, not the circuit operation speed, but a threshold voltage of a transistor. In the technique, the body bias is controlled to maintain the operation speed, so that the circuit speed can be compensated. However, when the threshold voltage varies, the leakage current cannot be compensated. If decrease in the voltage is further advanced and the threshold voltage of a transistor decreases in future, the variations in the threshold voltage become conspicuous. As a result, the leakage current increases, and the ratio of the power consumption corresponding to the leakage current in the power consumption of the circuit increases. Consequently, compensation of the leakage current is an important technique.

According to the invention, as a well bias control circuit for compensating the threshold voltage difference between a PMOS transistor and an NMOS transistor, in a part of the, region of a main circuit constructed by a CMOS, a control circuit simulating a critical path of the main circuit constructed by the CMOS and including a delay monitor for monitoring a delay in the path is formed in a process of forming the main circuit. The control circuit is provided with a PN Vt balance compensation circuit for compensating an output of the delay monitor in accordance with the threshold voltage difference between the PMOS and NMOS transistors, thereby compensating the circuit speed by monitoring the delay of the path and compensating the threshold voltage difference between the PMOS and NMOS transistors by the PN Vt balance compensation circuit.

BRIEF DESCRIPTION OF THE DRAWINGS

FIG. 16 is a diagram showing an example of a pattern table which can be employed in the third embodiment.

DESCRIPTION OF THE PREFERRED EMBODIMENTS

Before describing embodiments of the invention hereinbelow with reference to the drawings, a basic form of a semiconductor integrated circuit of the invention will be described by referring to FIG. 1.

Figure 1:
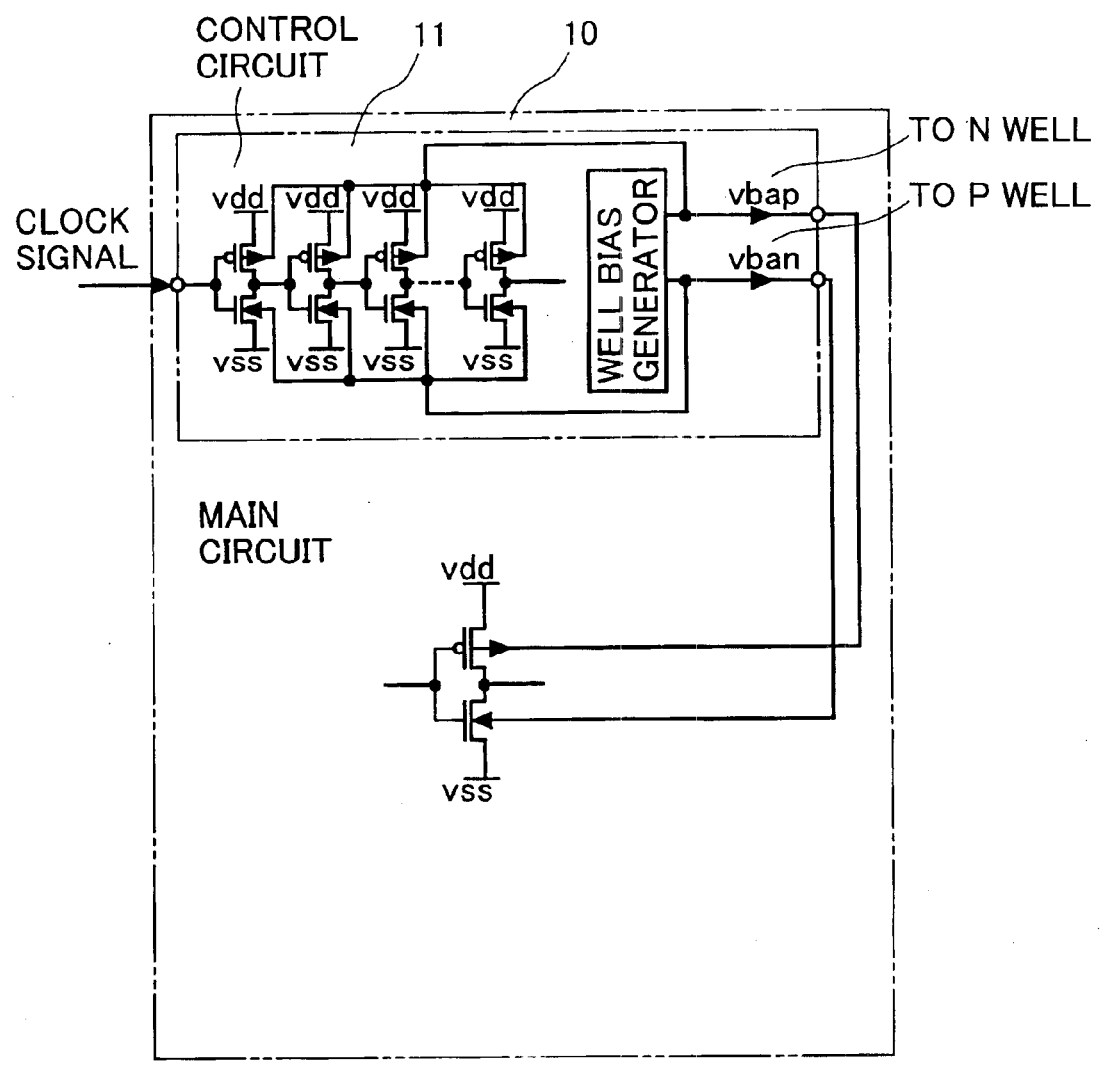
FIG. 1 is a diagram showing a basic form of a semiconductor integrated circuit of the invention.

In FIG. 1, 10 denotes a region in which a main circuit of a semiconductor integrated circuit of the invention is to be constructed. FIG. 1 schematically shows an inverter having a CMOS configuration as an example of a component circuit of the main circuit. Vdd denotes a power supply voltage, and Vss indicates a ground. 11 denotes a region in which a control circuit of the semiconductor integrated circuit of the invention is to be constructed and which occupies a part of the region 10 where the main circuit is to be formed. In the diagram, it seems that the control circuit 11 occupies many of the elements of the main circuit 10 but it is for convenience of forming the drawing. In reality, the control circuit 11 occupies about 1% or less of the main circuit 10. In the control circuit 11, a delay circuit obtained by cascade-connecting a number of inverters each having the same configuration as that of a CMOS inverter of the main circuit 10 and a well bias generator are schematically shown as representative components. The number of stages of cascade-connected inverters can be adjusted to simulate delay time corresponding to delay time of a circuit having the longest delay (called a critical path) in the main circuit. In the control circuit 11 as well, Vdd denotes a power supply voltage and Vss indicates a ground. As will be described later, the well bias generator generates bias voltages vbap and vban to an N well and a P well, respectively, appropriate to eliminate the threshold voltage difference between a PMOS transistor and an NMOS transistor in accordance with outputs of the delay circuit and a PN Vt balance compensation circuit. The bias voltages vbap and vban are supplied to the N well and P well of the control circuit 11 and the main circuit 10.

Embodiment I

Figure 2:
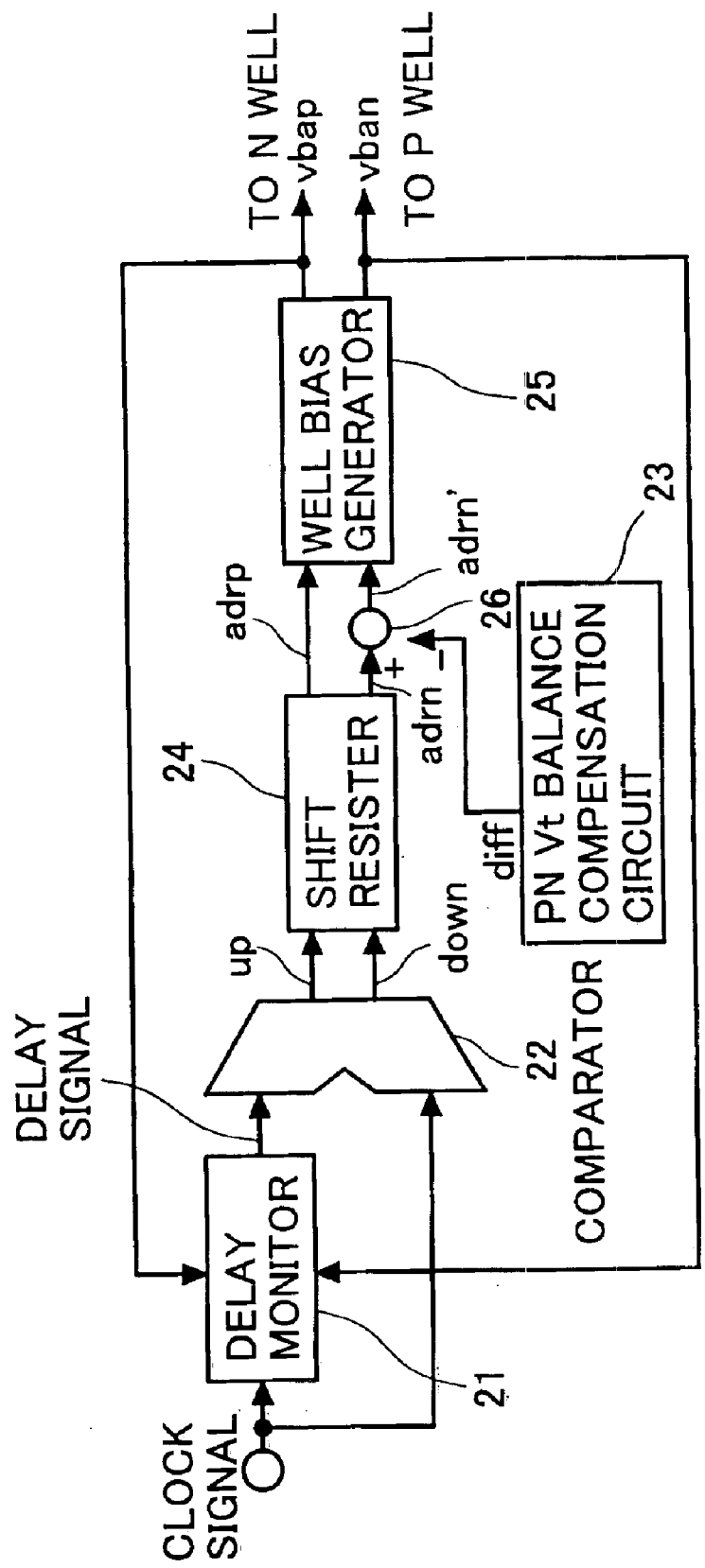
FIG. 2 is a block diagram showing a first embodiment of a control circuit 11 in FIG. 1.

FIG. 2 is a block diagram showing a first embodiment of the control circuit 11 illustrated in FIG. 1. In the embodiment, the control circuit 11 is constructed by a delay monitor 21, a comparator 22, a PN Vt balance compensation circuit 23, a shift register 24, a well bias generator 25, and an adder 26.

The delay monitor 21 is, as described above, to simulate a critical path of the main circuit 10 and receives a clock signal. The clock signal is a clock signal of the main circuit 10. From the delay monitor 21, therefore, a clock signal having a delay corresponding to delay time of the critical path of the main circuit 10 is obtained as a delay signal. The delay signal of the delay monitor 21 and the clock signal are supplied to the comparator 22. The comparator 22 compares the signals to detect a phase difference and outputs a signal "up" when the delay time is shorter than a design parameter or a signal "down" when the delay time is longer than the design parameter. The shift register 24 receives the signal "up" or "down". Each time the signal "up" is input, the shift register 24 increases a signal adrp as a control signal for PMOS well bias and a signal adrn as a control signal for NMOS well bias by one stage. On the contrary, each time the signal "down" is input, the shift register 24 decreases the signals adrp and adrn by one stage. The PN Vt balance compensation circuit 23 outputs a signal "diff" as a difference signal of the threshold voltage of the PMOS transistor and the threshold voltage of the NMOS transistor, which will be described in detail hereinlater. The signal diff as the difference signal acts so that the difference between the signals adrp and adrn of the shift register 24 corresponds to the signal diff, and is used to reflect the difference between the threshold voltage of the PMOS transistor and the threshold voltage of the NMOS transistor. 26 denotes the adder for reflecting the difference. The adder 26 adds the difference signal diff of the PN Vt balance compensation circuit 23 to the signal adrn of the shift register 24 with the sign shown in the diagram, thereby converting the signal, adrn to a signal adrn'. If the difference signal diff is positive, the difference between the signals adrp and adrn' increases. If the difference signal diff is negative, the difference between the signals adrp and adrn' decreases. Therefore, signal adrn' is a signal obtained by modifying the signals adrp and adrn of the shift register 24 only by an amount corresponding to the difference signal diff. The well bias generator 25 receives the signal adrp, determines vbap as the PMOS well bias signal. The well bias generator 25 also receives the signal adrn' and determines vban as the NMOS well bias signal. The well bias signals vbap and vban are supplied to the well terminals of the main circuit 10 and the delay monitor 21. That is, in the invention, by using the well bias signals, not only variations in delay time according to an output of the delay monitor but also variations in the threshold voltages of the PMOS and NMOS transistors can be compensated.

In the embodiment, when the signals adrp and adrn increase by one stage, the well bias signal voltages vbap and vban are increased by a predetermined voltage unit. When the signals adrp and adrn decrease by one stage, the well bias signal voltages vbap and vban are decreased by a predetermined voltage unit. In the specification, to increase the well bias in the direction of back bias of a MOSFET is expressed as "to increase the well bias", and to increase the well bias in the direction of forward bias is expressed as "to decrease the well bias". It is accordingly understood that when a back bias is applied to the well, the operation speed of the CMOS circuit decreases, and when a forward bias is applied, the operation speed increases.

Figure 3:
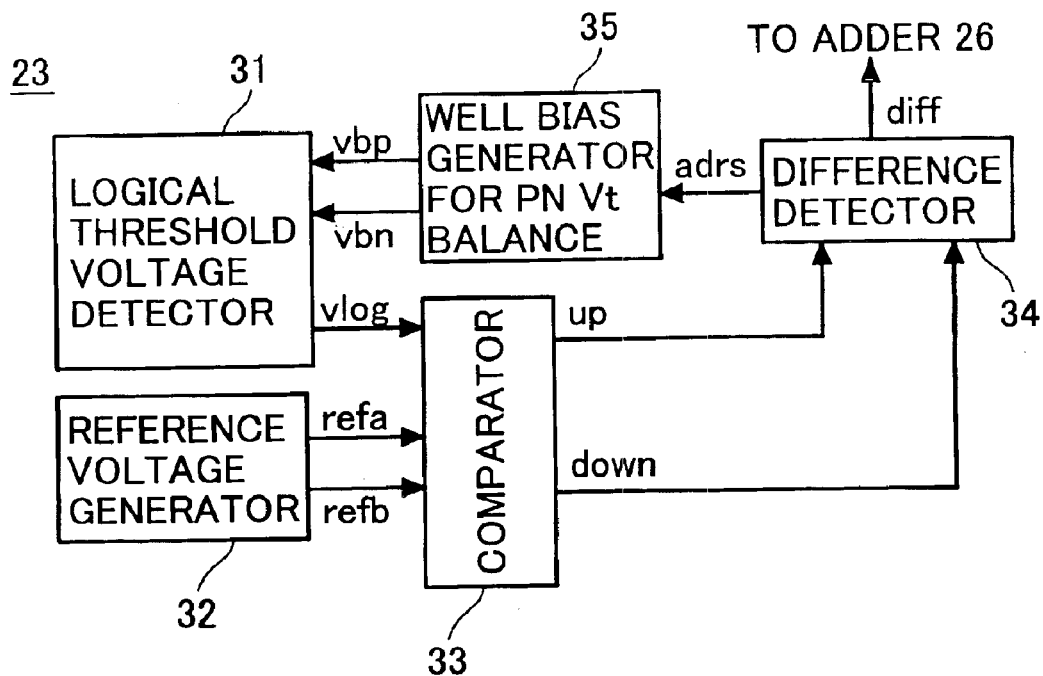
FIG. 3 is a block diagram showing an example of a PN Vt balance compensation circuit 23 in FIG. 2.

FIG. 3 is a block diagram showing an example of the PN Vt balance compensation circuit 23 in FIG. 2. The PN Vt balance compensation circuit 23 is constructed by a logical threshold voltage detector 31, a reference voltage generator 32, a comparator 33, a difference detector 34, and a well bias generator 35 for PN Vt balance.

The logical threshold voltage detector 31 detects the logical threshold voltage of a CMOS circuit and outputs the voltage as a signal vlog. The reference voltage generator 32 outputs two kinds of reference voltage signals refa and refb. The comparator 33 compares the signal voltage vlog with the signal voltages refa and refb, when the signal voltage vlog is higher than the signal voltages refa and refb, outputs the signal "up" and, when the signal voltage vlog is lower than the signal voltages refa and refb, outputs the signal "down". When the signal voltage vlog lies between the signal voltages refa and refb, both of the signals "up" and "down" are not output. The difference detector 34 increases the signal adrs by one stage each time the signal "up" is input and decreases the signal adrs by one stage each time the signal "down" is input. The difference detector 34 also outputs a deviation of the signal adrs from a standard value, that is, the difference between the signals "up" and "down" as the signal diff. The well bias generator 35 for PN Vt balance receives the signal adrs and outputs a signal vbp as a PMOS well bias and a signal vbn as an NMOS well bias. When the signal adrs increases by one stage, the well bias generator 35 for PN Vt balance increases each of the signals vbp and vbn by a predetermined voltage unit. When the signal adrs is decreased by one stage, the well bias generator 35 for PN Vt balance decreases each of the signal voltages vbp and vbn by a predetermined voltage unit. As initial values of the signal voltages vbp and vbn, design parameters are employed. Although both of the signals vbp and vbn are controlled in FIG. 3, either one of the signals vbp and vbn may be controlled.

Figure 4:
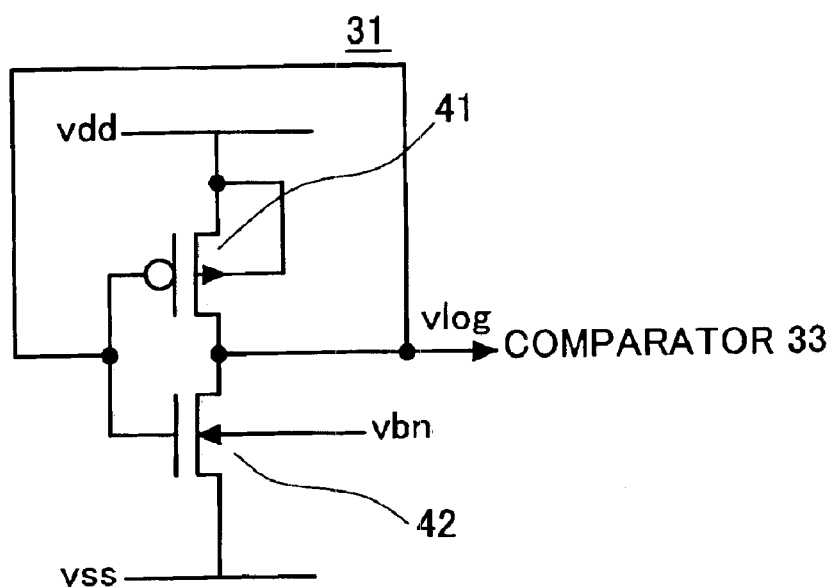
FIG. 4 is a diagram showing an example of a logical threshold voltage detector 31 in FIG. 3.

FIG. 4 shows an example of the logical threshold voltage detector 31 in FIG. 3. An output terminal and an input terminal of a CMOS inverter constructed by a PMOS transistor 41 and an NMOS transistor 42 are short-circuited, and the signal vlog is obtained at the node. The signal vlog is an output of the logical threshold voltage of the CMOS inverter. As an example of the logical threshold voltage, when it is assumed that the gate width of the PMOS transistor 41 is twice as wide as that of the NMOS transistor 42, the logical threshold voltage becomes almost the half of the power supply voltage. However, the invention is not particularly limited to the condition. The well voltage of the PMOS transistor 41 is connected to the power supply voltage Vdd. By controlling the well voltage signal vbn of the NMOS transistor 42, the logical threshold voltage of the CMOS inverter is controlled. In this example, the control is performed only by the signal vbn in FIG. 3.

The logical threshold voltage detector 31 is not limited to the circuit example of FIG. 4 but can be realized in various circuit modes. For example, it is also possible to reverse the relation of the PMOS transistor 41 and the NMOS transistor 42 and to control the well voltage signal vbp of the PMOS transistor 41, thereby controlling the logical threshold voltage of the CMOS inverter. The logical threshold voltage of the CMOS inverter may be controlled by controlling both of the well voltage signal vbp of the PMOS transistor 41 and the well voltage signal vbn of the NMOS transistor 42. Further, the logical threshold voltage detector 31 may be constructed by the PMOS transistor 41 and the NMOS transistor 42, the signal vlog is obtained at the drain of each of the PMOS transistor 41 and the NMOS transistor 42, and a gate voltage signal vgp of the PMOS transistor 41 and a gate voltage signal vgn of the NMOS transistor 42 are supplied. The well voltage of the PMOS transistor 41 is connected to the power supply voltage Vdd and the well voltage signal vbn of the NMOS transistor 42 is controlled, thereby controlling the signal voltage vlog. As an example of the logical threshold voltage in this case, when the gate width of the PMOS transistor 41 is set twice as wide as that of the NMOS transistor 42, the signal vgp is set to a power supply potential, and the signal vgn is set to a ground potential, the signal voltage vlog becomes almost the half of the power supply voltage. However, the invention is not limited particularly to the condition. In the standby mode, by fixing the signal vgp to the ground potential and fixing the signal vgn to the power supply potential, a penetration current can be eliminated. By reversing the relation between the PMOS transistor 41 and the NMOS transistor 42 in a similar configuration and controlling the well voltage signal vbp of the PMOS transistor 41, the logical threshold voltage of the CMOS inverter can be controlled. Further, by controlling both of the well voltage signal vbp of the PMOS transistor 41 and the well voltage signal vbn of the NMOS transistor 42 in a similar configuration, the logical threshold voltage of the CMOS inverter may be controlled.

Figure 5:
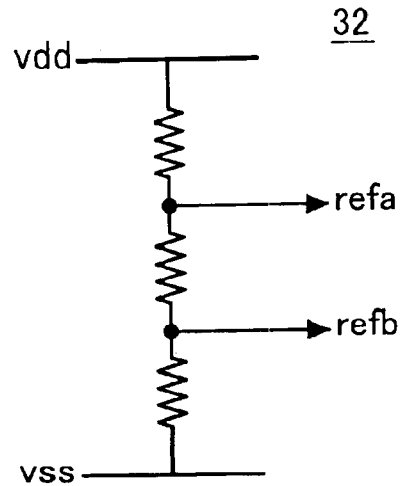
FIG. 5 is a diagram showing an example of a reference voltage generator 32 in FIG. 3.

FIG. 5 shows an example of the reference voltage generator 32 in FIG. 3. In the example, the reference voltage generator 32 is constructed by at least three resistors and, by dividing the power supply voltage Vdd, the reference voltage signals refa and refb are output.

Figure 6:
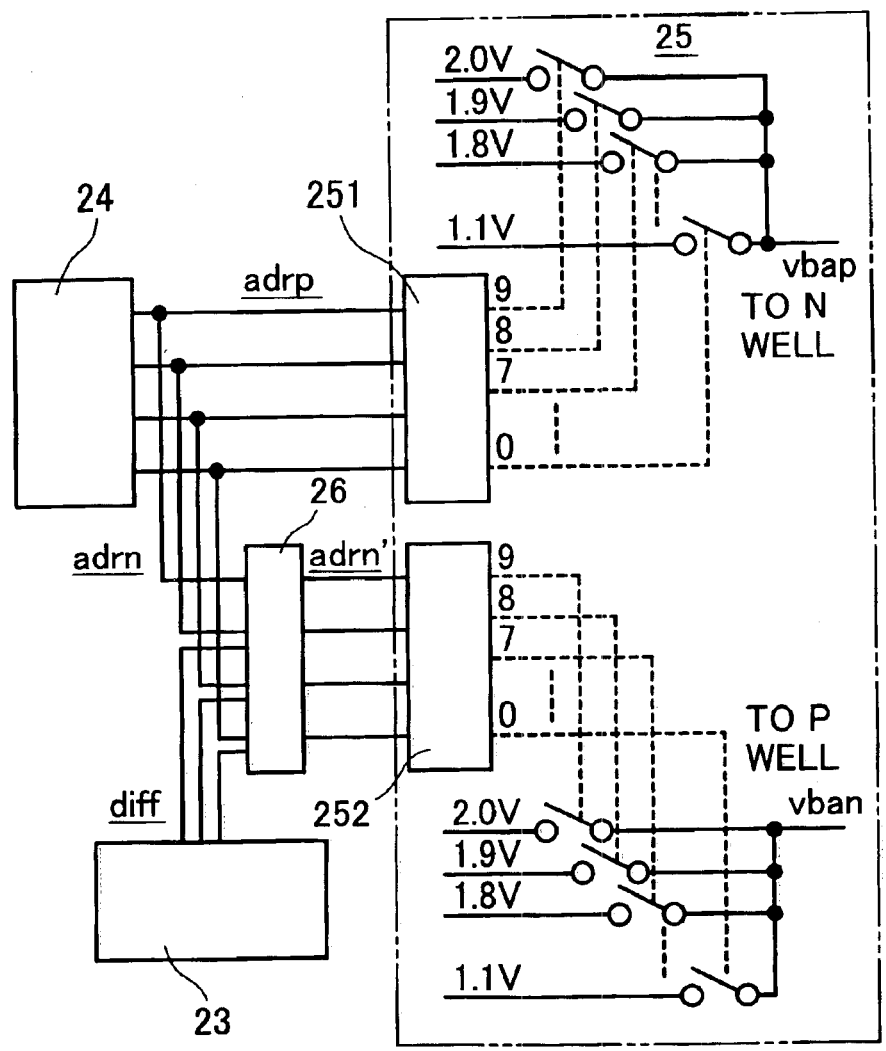
FIG. 6 is a diagram showing a concrete example of relations among the PN Vt balance compensation circuit 23, a shift register 24, a well bias generator 25, and an adder 26 by using the concrete example of the well bias generator 25 in FIG. 3 as a main component.

FIG. 6 shows a concrete example of the relations among the PN Vt balance compensation circuit 23, shift register 24, well bias generator 25, and adder 26 by using a concrete example of the well bias generator 25 in FIG. 2 as a main component. In the diagram, it is assumed that the well bias generator 25 can generate well biases of 10 levels. The shift register 24 receives the signals "up" and "down" and generates a signal adrp of four bits. In the example, the signal adrn is the same as the signal adrp. To the signal adrn, the difference signal diff of the PN Vt balance compensation circuit 23 is added by the adder 26, thereby converting the signal adrn into a signal adrn'. The difference signal diff consists of three bits from the LSD side of the signal adrp. The well bias generator 25 is provided with decoders 251 and 252. According to the signals adrp and adrn', a signal is output to any of output terminals 0 to 9. Further, as shown in the diagram, the well bias generator 25 has wires connected to the voltages sources of 1.1V to 2.0V in increments of 0.1V. As schematically shown by switches, according to a signal appearing at any of the output terminals 0 to 9 of the decoders 251 and 252, one of the voltages is selected and supplied as an N-well bias vbap and a P-well bias vban to each well terminal. For example, when a signal appears at the output terminal 8 of the decoder 251, the N-well bias vbap is set as 1.9V. When a signal appears at the output terminal 7 of the decoder 252, the P-well bias vban is set as 1.8V.

Figure 7:
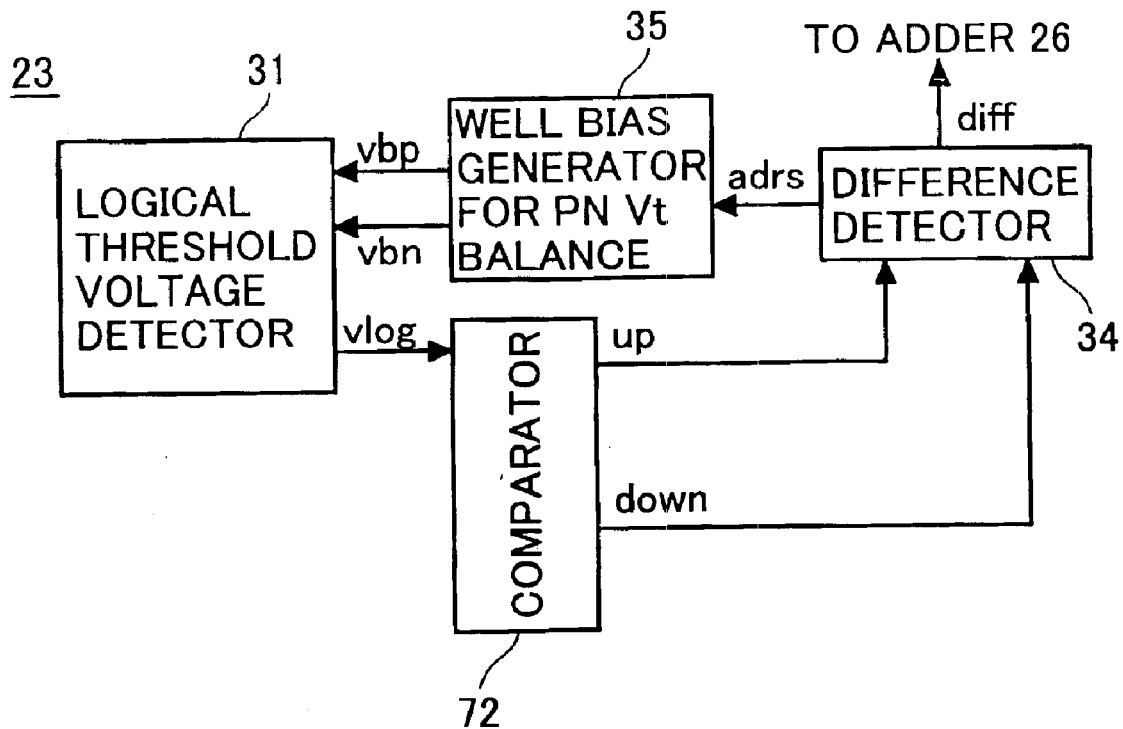
FIG. 7 is a block diagram showing another example of the PN Vt balance compensation circuit 23 in FIG. 2.

FIG. 7 is a block diagram showing another example of the PN Vt balance compensation circuit 23 in FIG. 2, which is constructed by the logical threshold voltage detector 31, a comparator 72, the difference detector 34, and the well bias generator 35 for PN Vt balance. As obviously understood from comparison with FIG. 3, in this example, a circuit corresponding to the reference voltage generator 32 can be omitted. It is realized by constructing the comparator 72 by two kinds of CMOS inverters of different logical threshold voltages corresponding to the reference voltage. The general operation of the PN Vt balance compensation circuit 23 in the configuration of FIG. 7 is similar to that of FIG. 2 except that the operation of the comparator 72 is different from that of the comparator 33 in FIG. 2.

Figure 8:
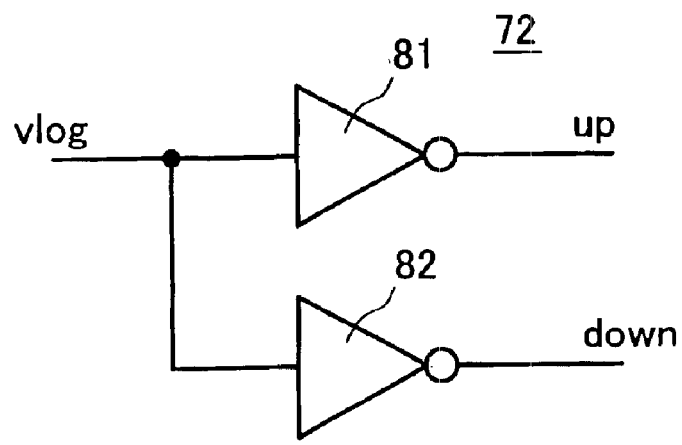
FIG. 8 is a circuit diagram showing an example of a comparator 72 in FIG. 7.

FIG. 8 is a circuit diagram showing an example of the comparator 72 in FIG. 7. The comparator 72 is constructed by two kinds of CMOS inverters 81 and 82 of different logical threshold voltages. The logical threshold voltage of the CMOS inverter 81 is set to be higher than that of the CMOS inverter 82. If the signal voltage vlog is higher than the logical threshold voltage of the CMOS inverter 81, the signal "up" is output. On the contrary, if the signal voltage vlog is lower than the logical threshold voltage of the CMOS inverter 82, the signal "down" is output. If the signal voltage vlog lies between the logical threshold voltage of the CMOS inverter 81 and the logical threshold voltage of the CMOS inverter 82, none of the signals "up" and "down" are output. That is, by using the threshold values, the circuit corresponding to the reference voltage generator 32 in FIG. 3 is omitted.

Although the signal adrn out of the signals adrp and adrn is modified with an output of the PN Vt balance compensation circuit in the first embodiment, the signal adrp may be modified. It is sufficient to change the modifying method according to the signal to be modified. This point will be the same in the following embodiments.

As described above, a signal for compensating the operation speed of the CMOS LSI is obtained by the delay monitor 21 and is modified with a signal of the PN Vt balance compensation circuit, thereby enabling the threshold voltage difference between the NMOS transistor and the NMOS transistor to be eliminated.

The effects of the control according to the embodiment will now be briefly described with reference to FIGS. 9 to 11.

Figure 9:
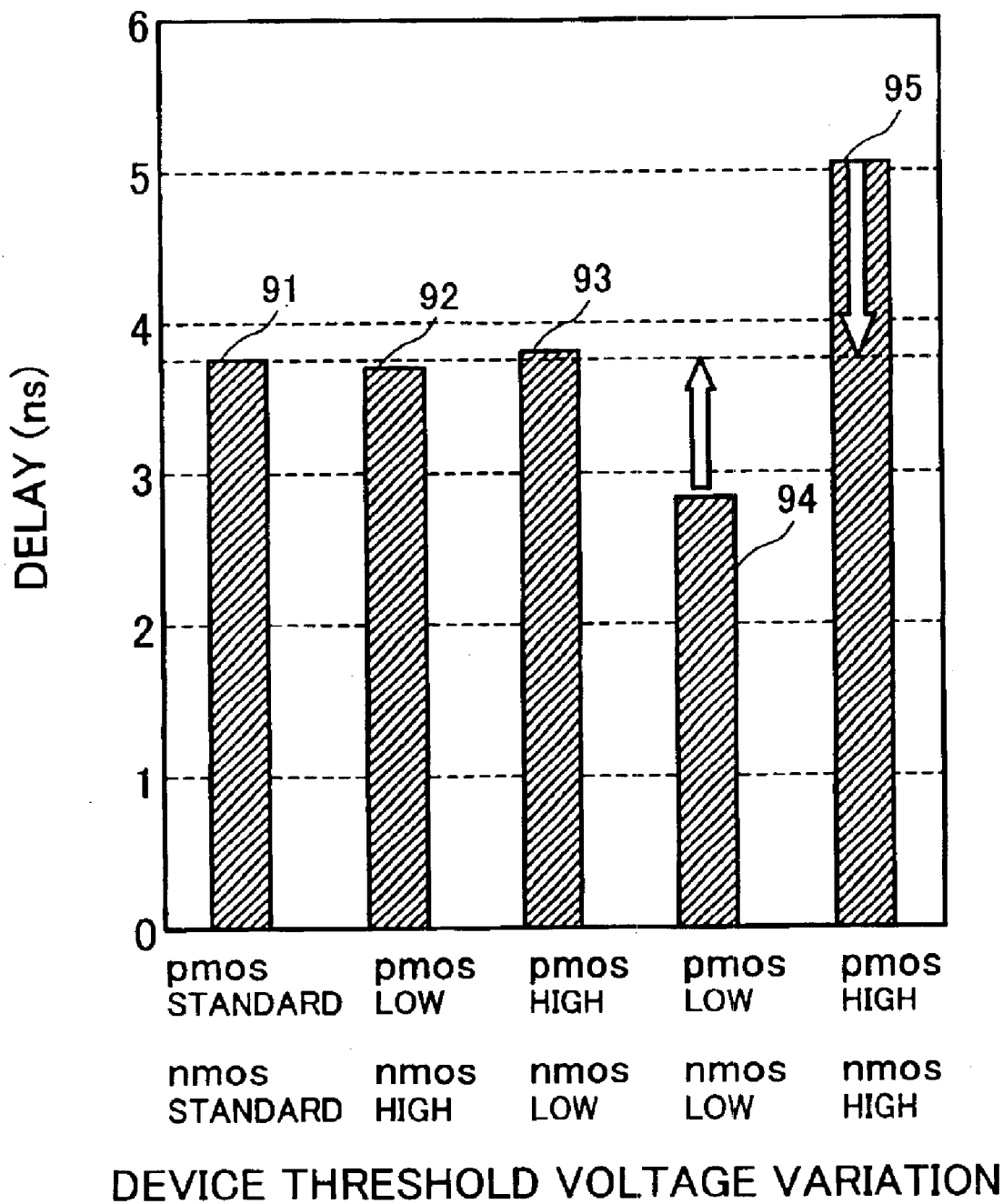
FIG. 9 is a diagram for explaining effects of the control according to the first embodiment.

FIG. 9 is a graph of delay time of a certain circuit with respect to variations in the threshold voltage of a device caused by fabrication variations. 91 denotes a delay of the circuit in which the threshold voltages of PMOS and NMOS transistors are equal to the design parameters. As shown as "pmos: standard" and "nmos: standard", the delay is about 3.8 ns. In contrast, in the case of "pmos: low" and "nmos: high" as shown by 92, delay is slightly reduced. In the case of "pmos: high" and "nmos: low" as shown by 93, delay is slightly increased. In the case of "pmos: low" and "nmos: low" as shown by 94, delay is largely reduced. In the case of "pmos: high" and "nmos: high" as shown by 95, delay is largely increased. "standard", "low", and "high" denote that "the threshold voltage of a transistor is almost equal to a design parameter", "the threshold voltage of a transistor is lower than a design parameter to a certain degree", and "the threshold voltage of a transistor is higher than a design parameter to a certain degree", respectively.

Figure 10:
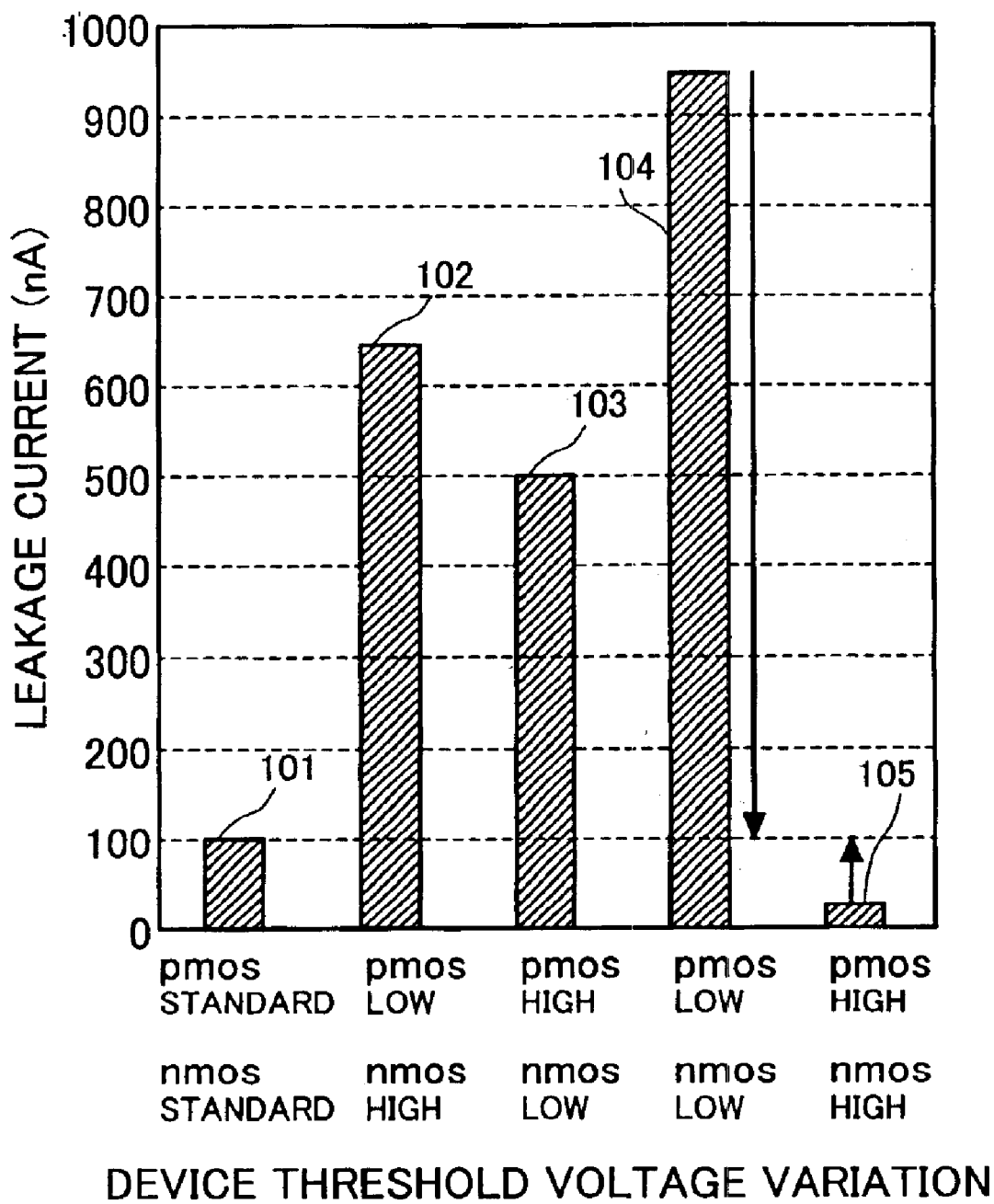
FIG. 10 is a diagram for explaining effects of the control according to the first embodiment.
Figure 11:
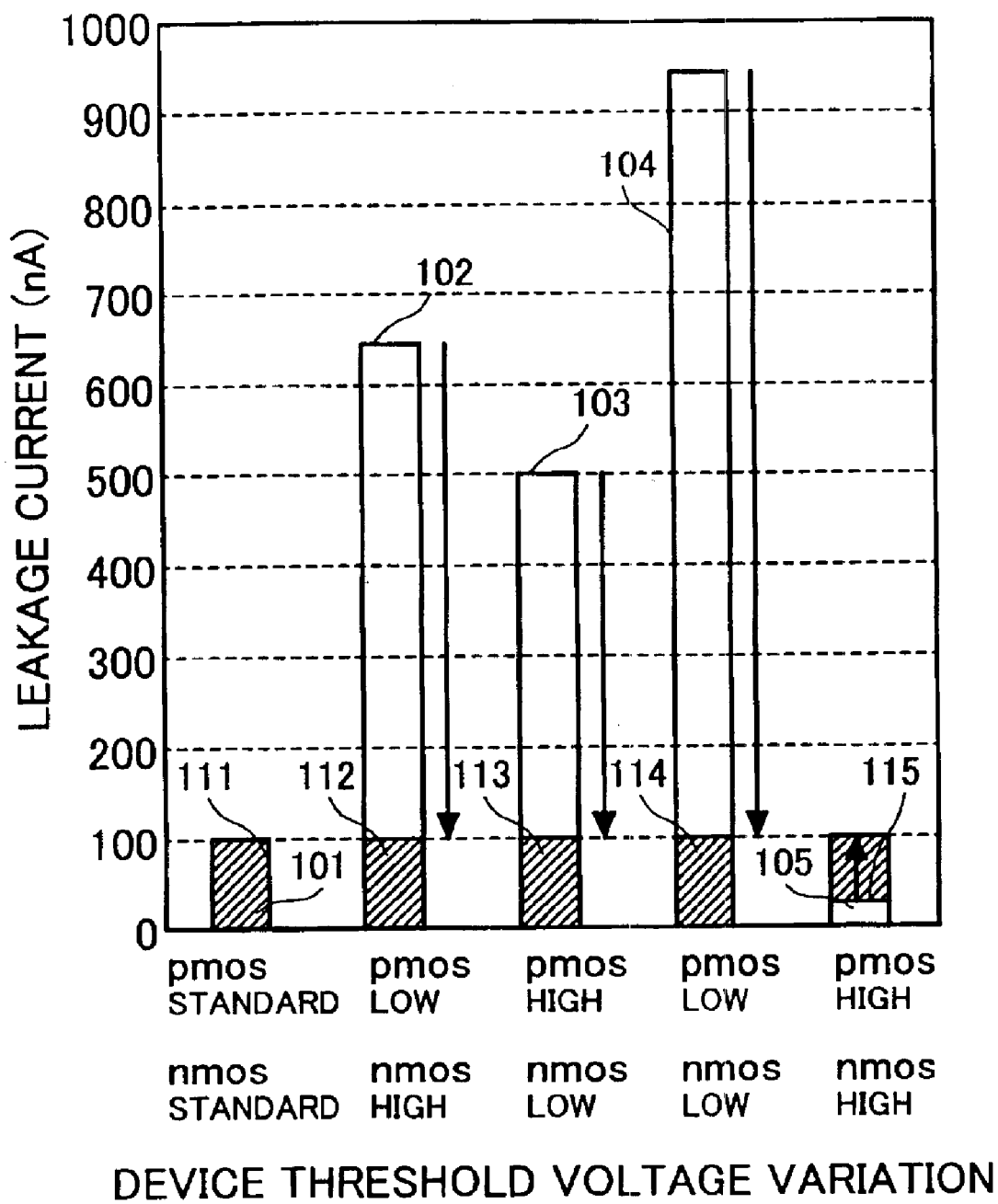
FIG. 11 is a diagram for explaining effects of the control according to the first embodiment.

FIG. 10 is a graph similarly showing the leakage current of a certain circuit with respect to variations in the threshold voltage of a device caused by fabrication variations. 101 denotes a leakage current of a circuit in which the threshold voltage of each of PMOS and NMOS transistors is equal to ac design parameter. As shown by "pmos: standard" and "nmos: standard", the leakage current is about 100 nA. In contrast, in the case of "pmos: low" and "nmos: high" as shown by 102 and in the case of "pmos: high" and "nmos: low" as shown by 103, the leakage current largely increases. On the other hand, in the case where "pmos: low" and "nmos: low" as shown by 104, the leakage current largely increases. In the case where "pmos: high" and "nmos: high" as shown by 105, the leakage current largely decreases.

When the well bias control is performed in correspondence with the operation speed (delay) like Japanese Unexamined Patent Application No. 2001-156261, as shown by a hollow arrow in FIG. 9, the delay is compensated to delay time 91 shown by the case of "pmos: standard" and "nmos: standard". As a result, as shown by solid-line arrows in FIG. 10, leakage currents indicated by 104 and 105 are also compensated to the leakage current 101 shown by the case of "pmos: standard" and "nmos: standard". However, as in the case of "pmos: low" and "nmos: high" and in the case of "pmos: high" and "nmos: low", when the delay is slightly shortened/increased as shown by 92 and 93, there is hardly a difference from the delay time in the case of "pmos: standard" and "nmos: standard". Consequently, effects of the well bias control corresponding to the delay do not substantially appear. As a result, the leakage current 102 in the case of "pmos: low" and "nmos: high" and the leakage current 103 in the case of "pmos: high" and "nmos: low" are compensated as shown in FIG. 10.

As in the invention, when the difference occurs between the threshold voltage of the PMOS transistor and the threshold voltage of the NMOS transistor, by controlling the well voltage so as to eliminate the threshold voltage difference, the variations in the leakage current can be compensated. FIG. 11 shows a state where all of the leakage currents 111 to 115 are compensated to the leakage current 101 shown in the case of "pmos: standard" and "nmos: standard".

Embodiment II

Figure 12:
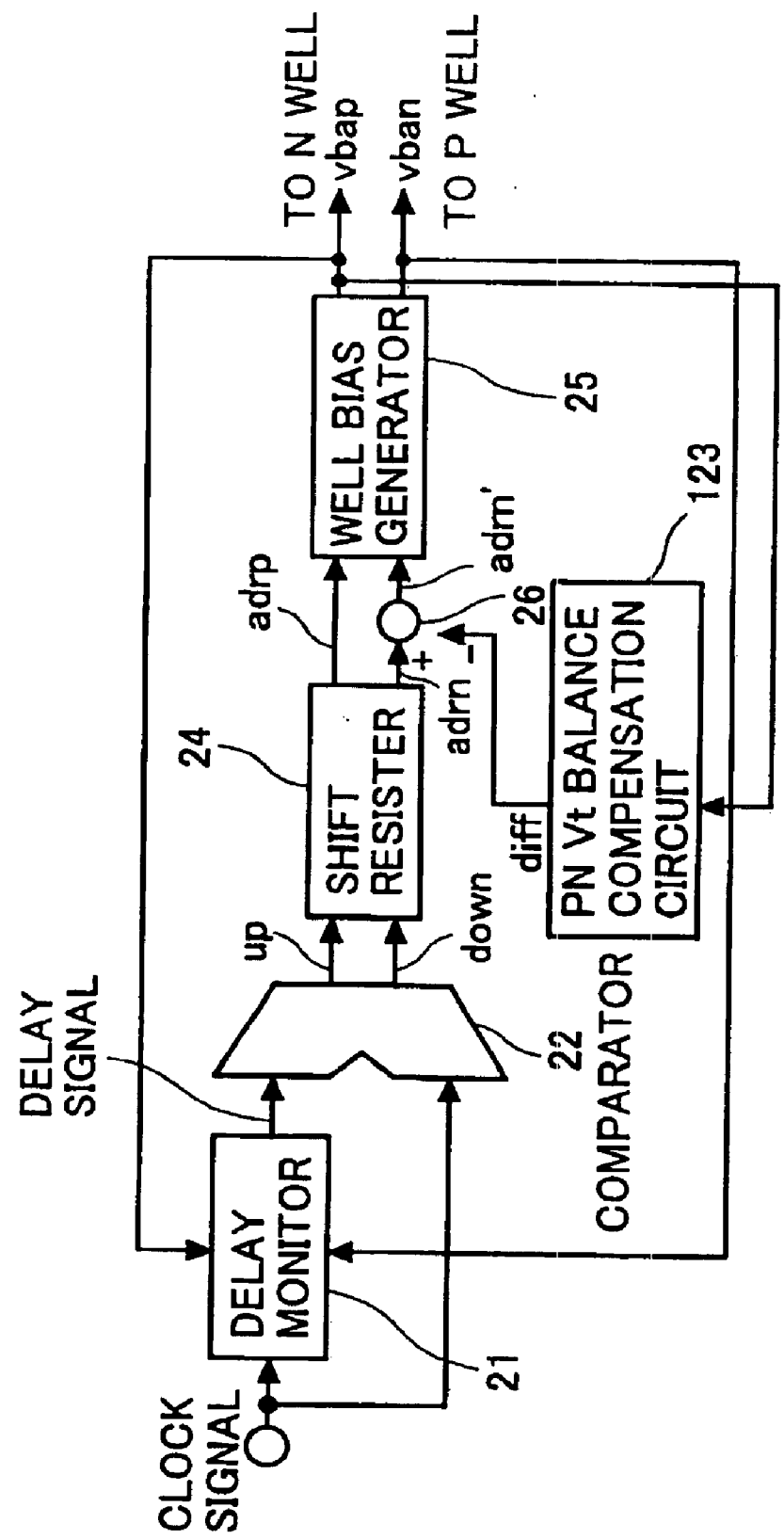
FIG. 12 is a block diagram showing a second embodiment of the control circuit 11 in FIG. 1.

FIG. 12 is a block diagram showing a second embodiment of the control circuit 11 illustrated in FIG. 1. In the embodiment, the control circuit 11 is constructed by the delay monitor 21, comparator 22, PN Vt balance compensation circuit 123, shift register 24, well bias generator 25, and adder 26.

Figure 13:
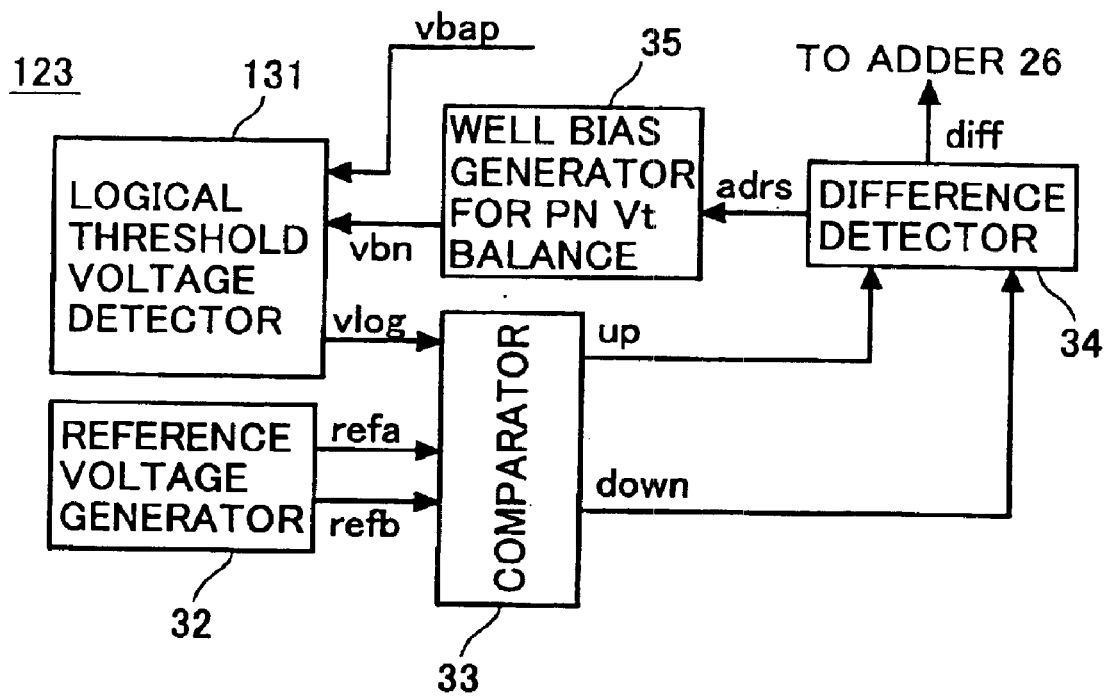
FIG. 13 is a block diagram showing an example of a PN Vt balance compensation circuit 123 in FIG. 12.
Figure 14:
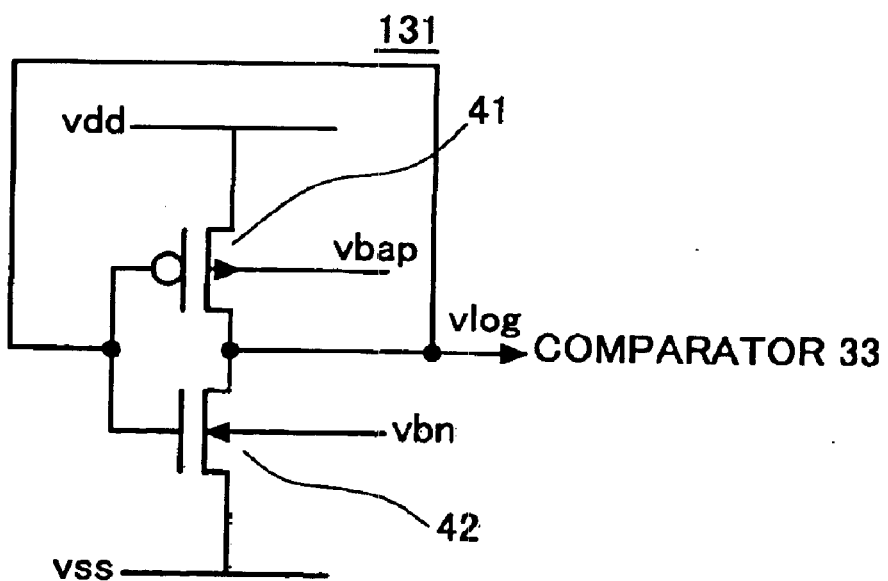
FIG. 14 is a diagram showing an example of a logical threshold voltage detector 131 in FIG. 13.

As easily understood from comparison between FIGS. 12 and 2, the control circuit 11 of second embodiment has the same configuration as that of the first embodiment except for the point that the N well voltage vbap is applied to the PN Vt balance compensation circuit 123. The basic operation is the same as that of the first embodiment. FIG. 13 is a block diagram showing an example of the PN Vt balance compensation circuit 123 in FIG. 12. The PN Vt balance compensation circuit 123 is constructed by a logical threshold voltage detector 131, the reference voltage generator 32, comparator 33, difference detector 34, and well bias generator 35 for PN Vt balance. As easily understood from comparison between FIGS. 13 and 3, the configurations are the same except for the points that vbp as one of outputs of the well bias generator 35 for PN Vt balance is omitted and the N well voltage vbap is applied in place of the voltage vbp applied from the well bias generator 35 for PN Vt balance to the logical threshold detector 131. The basic operation is the same as that of the PN Vt balance compensation circuit 23 in the first embodiment. FIG. 14 shows an example of the logical threshold voltage detector 131 in FIG. 13. Also in FIG. 14, in a manner similar to the logical threshold voltage detector 31 illustrated in FIG. 4, the output terminal and the input terminal of a CMOS inverter constructed by the PMOS transistor 41 and the NMOS transistor 42 are short-circuited, and the signal vlog is obtained at the node. The signal vlog becomes an output of the logical threshold voltage of the CMOS inverter. Although the well voltage of the PMOS transistor 41 is connected to the power supply voltage Vdd in FIG. 4, in FIG. 14, the well voltage of the PMOS transistor 41 is controlled by the N well voltage vbap and the well voltage of the NMOS transistor 42 is controlled by the signal voltage vbn applied from the well bias generator 35 for PN Vt balance, thereby controlling the logical threshold voltage of the CMOS inverter.

In the second embodiment, in a manner similar to the first embodiment, the delay of the CMOS LSI can be compensated and the threshold voltage difference between the PMOS transistor and the NMOS transistor can be eliminated. In addition, by feeding back the signal vbap to the PN Vt balance compensation circuit 23, even if the threshold voltage difference occurs between the PMOS transistor and the NMOS transistor at the time of changing the signals vbap and vban in order to compensate delay, the difference can be compensated.

Although the signal vbap is supplied to the PN Vt balance compensation circuit 123 in the second embodiment, the signal vban may be supplied to the PN Vt balance compensation circuit 123. In this case, it is sufficient to accordingly control each of the well voltages in FIG. 14.

Embodiment III

Figure 15:
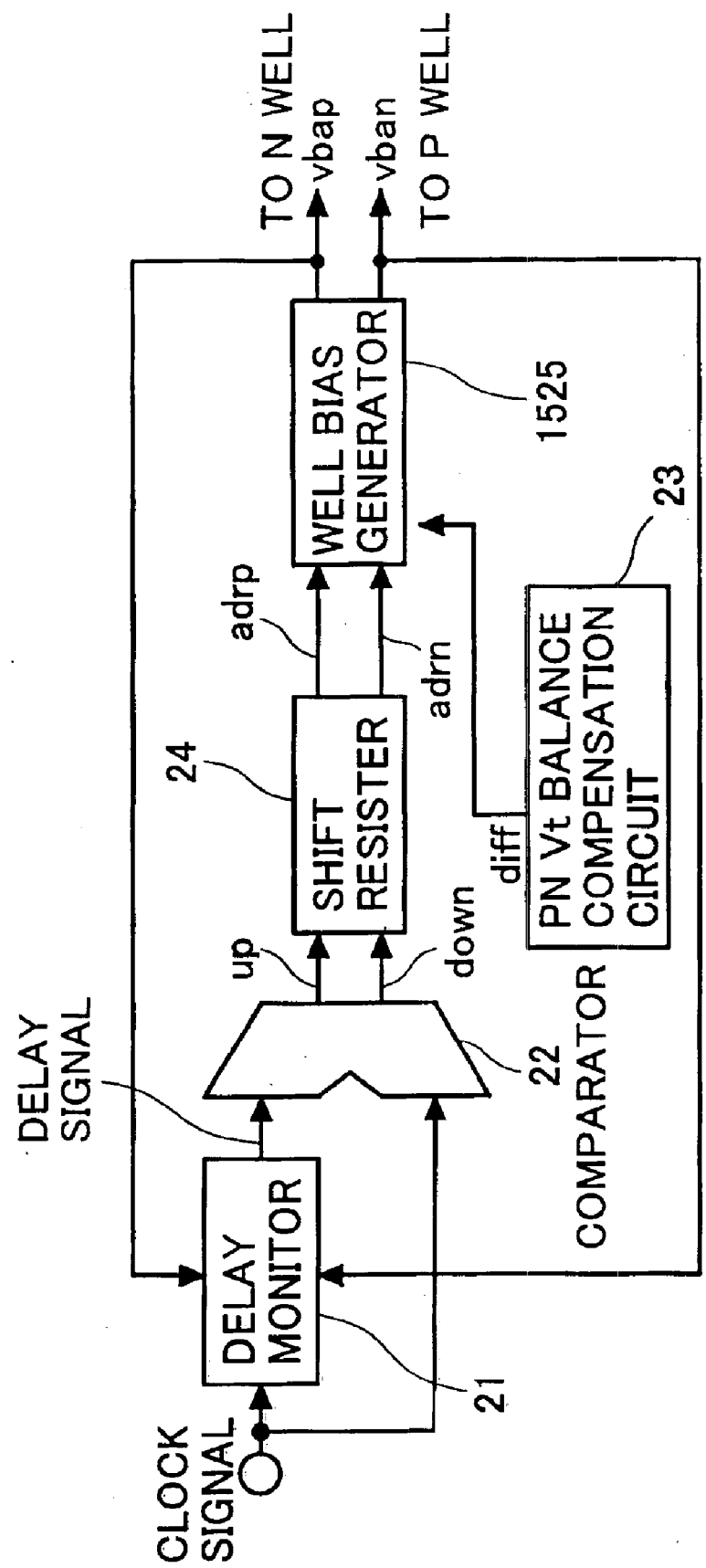
FIG. 15 is a block diagram showing a third embodiment of the control circuit 11 in FIG. 1.

FIG. 15 is a block diagram showing a third embodiment of the control circuit 11 illustrated in FIG. 1. In the embodiment, the control circuit 11 is constructed by the delay monitor 21, comparator 22, PN Vt balance compensation circuit 23, shift register 24, and a well bias generator 1525.

As easily understood from comparison between FIG. 15 and FIGS. 2 and 12, the control circuit 11 of the third embodiment has the same configuration as that of the first or second embodiment except for the point that outputs of the shift register 24 and the PN Vt balance compensation circuit 23 are directly applied to the well bias generator 1525. The basic operation is the same as that of the first or second embodiment. In the third embodiment, in place of modifying the output of the well bias generator 25 according to the output of the shift register 24 by the adder 26 with an output of the PN Vt balance compensation circuit 23, an output of the well bias generator 1525 is obtained by a table lookup method.

FIG. 16 shows an example of a pattern table which can be employed in the embodiment. In FIG. 16, diff denotes an output of the PN Vt balance compensation circuit 23, and adrp and adrn denote output signals of the shift register 24. The numerals from 0 to 9 indicated in adrp and adrn correspond to the numbers of output terminals of the decoders 251 and 252 shown in FIG. 6. In correspondence with the number, in a manner similar to FIG. 6, a well bias voltage is output adrp and adrn indicate a combination of numbers corresponding to voltages to be applied as well biases when the logical threshold voltage is equal to the design parameter. Specifically, in the example of FIG. 16, when the output signal diff of the PN Vt balance compensation circuit 23 is 0, adrp and adrn are set so as to have the difference of only 1 in number. It means that, in the example of FIG. 6, there is a difference of 0.1V between the logical threshold values of PMOS and NMOS transistors.

When the signal "up" is given from the shift register 24 in a state where diff is 0 and adrp and adrn are 5 and 4, respectively, adrp and adrn are incremented by one and 6 and 5 are output, respectively. On the contrary, when the signal "down" is given, adrp and adrn are decremented by one and 4 and 3 are output, respectively. As a result, while maintaining the same difference, the well potential is increased or decreased step by step in accordance with the signal "up" or "down".

When it is assumed that the output signal diff of the PN Vt balance compensation circuit 23 changes to 1 in a state where diff is 0 and adrp and adrn are 5 and 4, respectively, adrp and adrn change to 5 and 3, respectively. Specifically, by the change of only 1 in the signal diff, the signal adrn is changed only by 1 in the direction of increasing the difference. On the other hand, when diff changes to −1, each of the signals adrp and adrn changes to 5. That is, by the change of only 1 in the signal diff, the signal adrn is changed in the direction of decreasing the difference only by one. As a result, the well potential acts so as to increase or decrease the difference in accordance with the signal diff. The values which are output as initial values of the table of the embodiment correspond to the logical threshold voltages of the PMOS and NMOS transistors.

Embodiment IV

Figure 17:
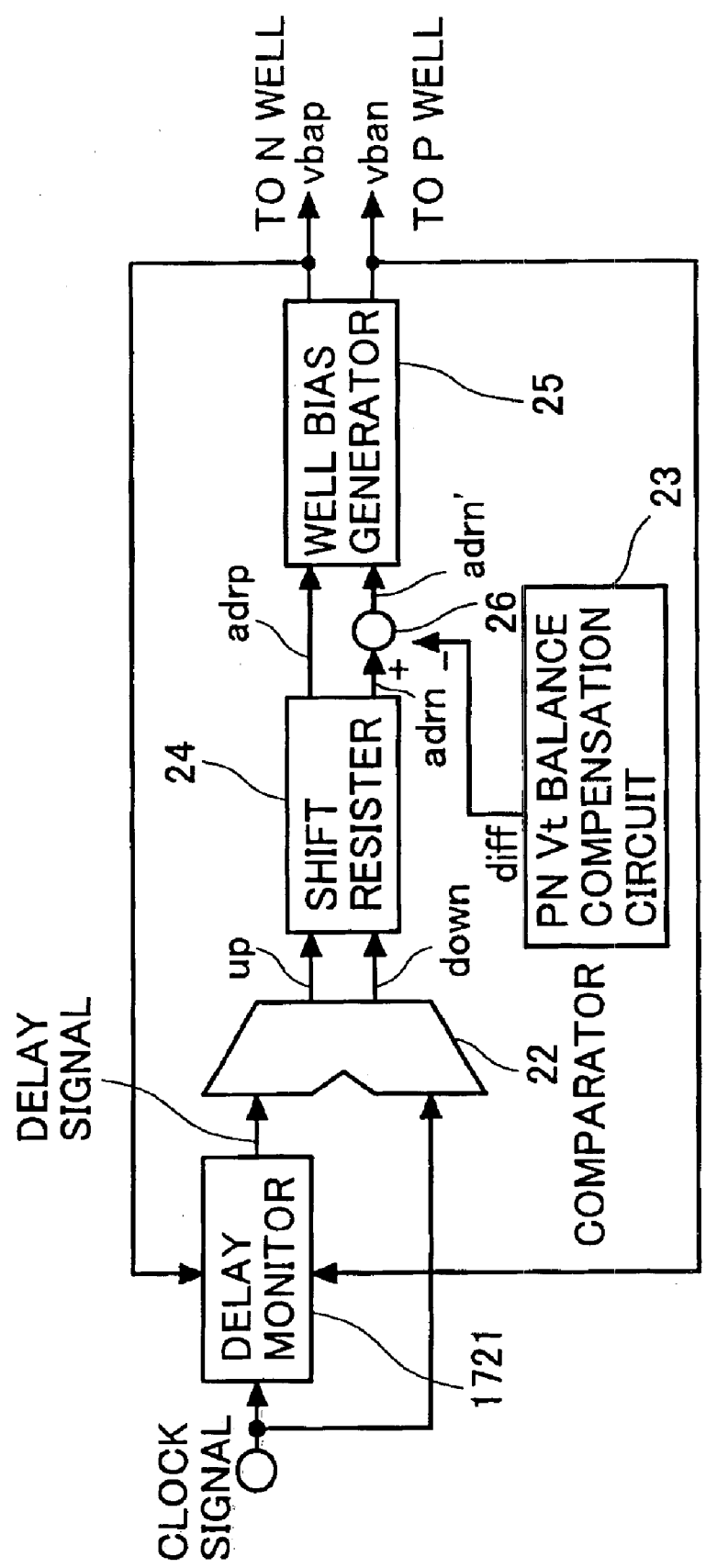
FIG. 17 is a block diagram showing a fourth embodiment of the control circuit 11 in FIG. 1.

FIG. 17 is a block diagram showing a fourth embodiment of the control circuit 11 illustrated in FIG. 1. In the embodiment, the control circuit 11 is constructed by a delay monitor 1721, comparator 22, PN Vt balance compensation circuit 23, shift register 24, well bias generator 25, and adder 26.

As easily understood from comparison between FIG. 17 and FIG. 2, the control circuit 11 of the fourth embodiment has the same configuration as that of the first embodiment and the basic operation is the same as that of the first or second embodiment. However, the delay monitor 1721 of the fourth embodiment has therein a plurality of delay circuits. Even in the case where the critical path of the main circuit is replaced with another path due to a factor such as fluctuation in the power supply voltage, a well bias voltage corresponding to a change in the critical path can be generated.

Figure 18:
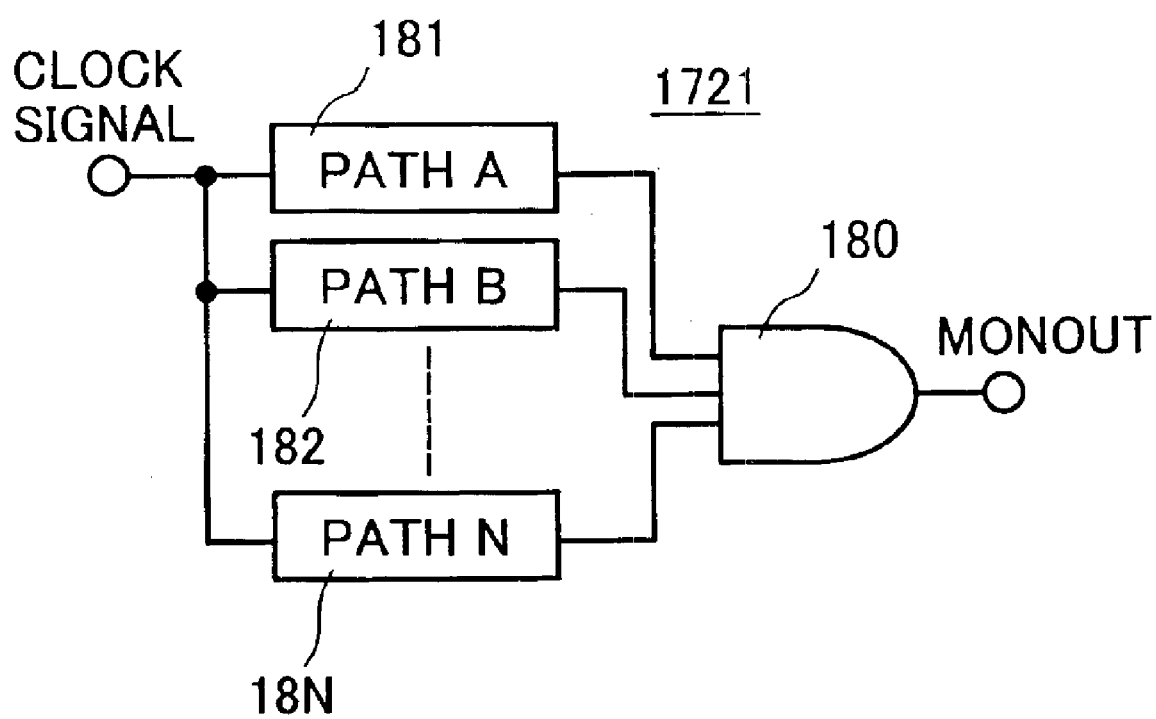
FIG. 18 is a block diagram showing an example of a delay monitor 1721 in FIG. 17.

FIG. 18 is a block diagram showing an example of the delay monitor 1721 in FIG. 17. In the example, as paths corresponding to the delay circuit illustrated in FIG. 1, a path A 181, a path B 182, . . . , and a path N 18N are provided. To each of the paths, a clock signal is supplied. Each of the paths has a configuration corresponding to a circuit having a critical path to be represented in the main circuit 10. Outputs of the paths 181, . . . , and 18N are supplied to an AND gate 180. The AND gate 180 generates an output only after all of the paths 181, . . . , and 18N generate outputs, that is, after a path having the largest delay generates an output.

In a semiconductor integrated circuit device to which the present invention is directed, when circuit operation environments such as power supply voltage and temperature change, it is feared that the critical path of the main circuit in design is replaced with another path. To deal with such a situation, the delay monitor 1721 has to have at least two paths simulating paths each of which can be a critical path of the main circuit in accordance with the circuit operation environments as shown in FIG. 18 and select a path having the optimum delay corresponding to the change from the paths in the circuit operation environments, as a function of selecting a path having the largest delay amount. Although the AND gate 180 is shown as a circuit for selecting a path having the largest delay amount in FIG. 18, the circuit is not limited to the AND gate 180 as long as a circuit realizes an equivalent function.

Figure 19A:
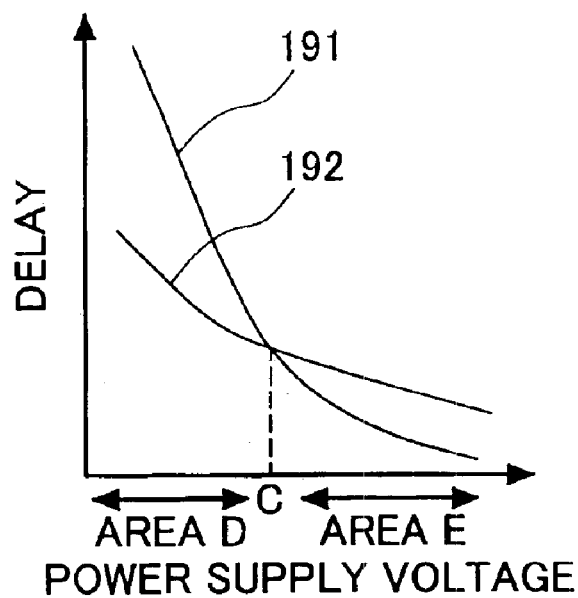
FIGS. 19A and 19B are graphs showing a state where a critical path of a main circuit is replaced with another path by taking an example of two paths.
Figure 19B:
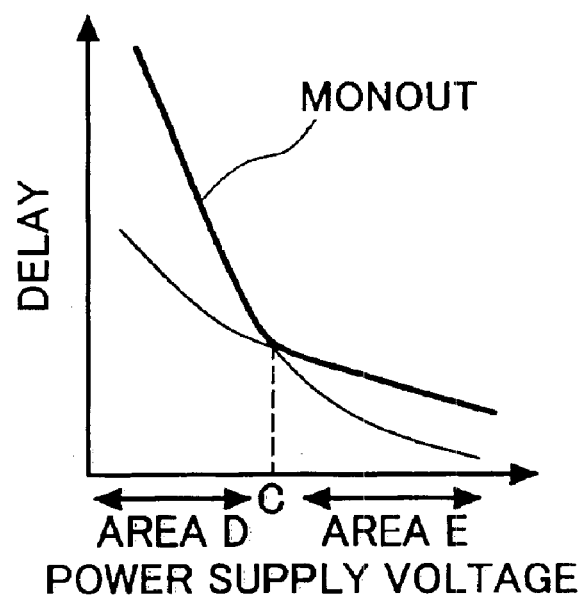

FIGS. 19A and 19B show a state where the critical path of the main circuit is replaced with another path by taking an example of two paths. In FIG. 19A, 191 and 192 denote delay time characteristics of paths A and B in the main circuit with respect to the power supply voltage. When an area in which the power supply voltage is lower than the point C is set as an area D and an area in which the power supply voltage is higher than the point C is set as an area E, in the area D, the path A 191 has longer delay time, so that the path A is the critical path in the main circuit. In the area E, the path B 192 has longer delay time, so that the path B is the critical path. For the main circuit having such a characteristic, when a well bias is controlled by constructing the delay monitor only by one path, for example, the path A, proper control can be performed only in the area D. In the area E, the critical path of the main circuit is not correctly simulated, so that the well bias is not properly controlled.

In the embodiment, as shown in FIG. 19B, a path having longer delay time is automatically selected in correspondence with the power supply voltage at the time of circuit operation and the delay time is detected as an MONOUT signal. Consequently, even if the critical path of the main circuit is replaced with another path, delay for the critical path of the main circuit can be always monitored, and the circuit operation speed can be compensated to a design parameter.

The operation of the fourth embodiment is the same as that of the first embodiment except for the point of selecting the largest delay. Consequently, even when the critical path of the main circuit is replaced with another path due to a factor such as fluctuations in the power supply voltage, a more appropriate well voltage addressing the change in the critical path and subjected to PN Vt balance compensation can be applied.

Embodiment V

Figure 20:
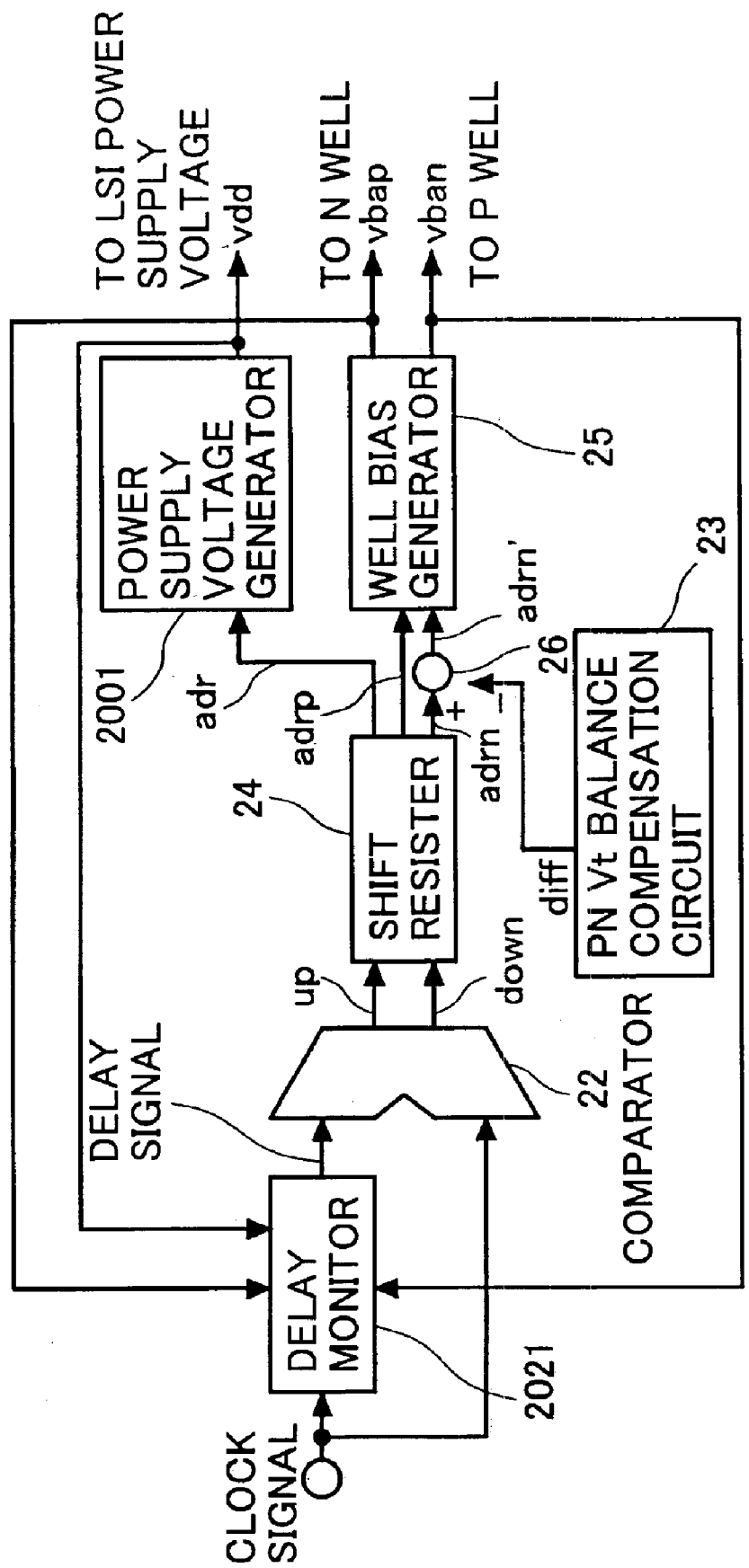
FIG. 20 is a block diagram showing a fifth embodiment of the control circuit 11 in FIG. 1.

FIG. 20 is a block diagram showing a fifth embodiment of the control circuit 11 described in FIG. 1. In the embodiment, the control circuit 11 is constructed by a delay monitor 2021, comparator 22, PN Vt balance compensation circuit 23, shift register 24, well bias generator 25, adder 26, and a power supply voltage generating circuit 2001.

As easily understood from comparison between FIGS. 20 and 2, the fifth embodiment has the same configuration as the first embodiment except for the point that the power supply voltage generating circuit 2001 is added and a power supply voltage vdd of an LSI is controlled in accordance with adr representing an output adrp or adrn of the shift register 24, and the point that not only the well voltages vbap and vban output from the well bias generator 25 but also the output voltage vdd of the power supply voltage generating circuit 2001 are fed, back to the delay monitor 2021. The basic operation is the same as that of the first embodiment.

In the fifth embodiment, initial values of the outputs adrp, adrn, and adr of the shift register 24 correspond to design parameters of an LSI of the main circuit. The well voltages vbap and vban and the power supply voltage vdd corresponding to the outputs also correspond to the design parameters. In the fifth embodiment, since the output voltage vdd of the power supply voltage generating circuit 2001 is also fed back to the delay monitor 2021 simulating the critical path, without requiring any operation for a change in the power supply voltage, a delay signal having delay time corresponding to the change is obtained. Thus, an LSI having an optimum well bias voltage according to a change in the circuit operation environments such as the power supply voltage and temperature can be realized.

Obviously, in each of the fourth and fifth embodiments, in place of the adder, a table look-up method may be employed.

According to the invention, a CMOS LSI can be realized in which a well bias is supplied to each of a PMOS transistor and an NMOS transistor so as to compensate the operation speed to desired speed and to eliminate the threshold voltage difference between the PMOS and NMOS transistors.

What is claimed is:

1. A semiconductor integrated circuit device comprising:
   a first circuit comprising a first MOS transistor of a first conductivity type and a second MOS transistor of a second conductivity type,
   a delay monitor circuit comprising a third MOS transistor of the first conductivity type and a fourth MOS transistor of the second conductivity type, and outputting a delay signal,
   a first comparator comparing the delay signal with a clock signal and outputting a first control signal and a second control signal,
   a well bias voltage generator outputting a first well bias voltage to the first MOS transistor and the third MOS transistor and outputting a second well bias voltage to the second MOS transistor and the fourth MOS transistor, and
   a compensation circuit comprising a fifth MOS transistor of the first conductivity type and a sixth MOS transistor of the second conductivity type, and outputting a difference signal, the difference signal based on the difference between a threshold voltage of the fifth MOS transistor and a threshold voltage of the sixth MOS transistor,
   wherein the well bias voltage generator outputs the first well bias voltage controlled by the first control signal and outputs the second well bias voltage controlled by the second control signal adjusted by the difference signal.

2. A semiconductor integrated circuit device according to claim 1,
   wherein the compensation circuit further comprises,
   a first CMOS inverter comprising the fifth MOS transistor and the sixth MOS transistor and outputting a first logical threshold voltage,
   a reference voltage generator outputting a first reference voltage and a second reference voltage lower than the first reference voltage,
   a second comparator comparing the first logical threshold voltage with the first and second reference voltages, and outputting a first signal and a second signal, and
   a difference detector detecting the difference between the first signal and the second signal, and outputting the difference signal.

3. A semiconductor integrated circuit device according to claim 2,
   wherein the second comparator outputs the first signal when the first logical threshold voltage is higher than the first reference voltage, and outputs the second signal when the first logical threshold voltage is lower than the second reference voltage.

4. A semiconductor integrated circuit device according to claim 1,
   wherein the compensation circuit further comprises,
   a first CMOS inverter comprising the fifth MOS transistor and the sixth MOS transistor and outputting a first logical threshold voltage,
   a second comparator comprising a second CMOS inverter having a second logical threshold voltage, and a third CMOS inverter having a third logical threshold voltage lower than the second logical threshold voltage, comparing the first logical threshold voltage with the second and third threshold voltages and outputting a first signal and a second signal, and
   a difference detector detecting the difference between the first signal and the second signal, and outputting the difference signal.

5. A semiconductor integrated circuit device according to claim 4,
   wherein the second comparator outputs the first signal when the first logical threshold voltage is higher than the second logical threshold voltage, and outputs the second signal when the first logical threshold voltage is lower than the third logical threshold voltage.

6. A semiconductor integrated circuit device according to claim 1,
   wherein the well bias voltage generator changes the second control signal in comparison to the first control signal based on the difference signal by using a table lookup method.

7. A semiconductor integrated circuit device according to claim 1,
   wherein the first circuit further comprises a critical path comprising the first MOS transistor and the second MOS transistor, and having a delay time,
   wherein the delay monitor circuit further comprises a path comprising the third MOS transistor and the fourth MOS transistor and simulating the critical path, and outputting the delay signal by simulating the delay time.

8. An output method for outputting first and second well bias voltages to a first circuit comprised of a first MOS transistor of a first conductivity type and a second MOS transistor of a second conductivity type, comprising:
   outputting a delay signal from a delay monitor circuit comprising a third MOS transistor of the first conductivity type and a fourth MOS transistor of the second conductivity type,
   comparing the delay signal with a clock signal by a first comparator,
   outputting a first control signal and a second control signal from the first comparator,
   outputting a difference signal from a compensation circuit, the difference signal based on a difference between a threshold voltage of a fifth MOS transistor of the first conductivity type and a sixth MOS transistor of the second conductivity type,
   adjusting the second control signal using the difference signal in comparison to the first control signal, and
   outputting the first well bias voltage controlled by the first control signal to the first and third MOS transistors, and outputting the second well bias voltage controlled by the second control signal adjusted by the difference signal to the second and fourth MOS transistors.

9. An output method for outputting first and second well bias voltages according to claim 8, further comprising:
   outputting a first logical threshold voltage from a first CMOS inverter, the first CMOS inverter comprising the fifth MOS transistor and the sixth MOS transistor,
   outputting a first reference voltage and a second reference voltage lower than the first reference voltage from a reference voltage generator,
   comparing the first logical threshold voltage with the first and second reference voltages by a second comparator,
   outputting a first signal and a second signal from the second comparator to a difference detector, and outputting the difference signal by detecting a difference of the first signal and the second signal in the difference detector.

10. An output method for outputting first and second well bias voltages according to claim 9, further comprising:

outputting the first signal when the first logical threshold voltage is higher than the first reference voltage, and outputting the second signal when the first logical threshold voltage is lower than the second reference voltage.

11. An output method for outputting first and second well bias voltages according to claim 8, further comprising:

outputting a first logical threshold voltage from a first CMOS inverter, the first CMOS inverter comprising the fifth MOS transistor and the sixth MOS transistor, comparing the first logical threshold voltage with a second logical threshold voltage of a second CMOS inverter, and with a third logical threshold voltage of a third CMOS inverter by a second comparator, outputting a first signal and a second signal from the second comparator to a difference detector, and outputting the difference signal by detecting a difference of the first signal and the second signal in the difference detector.

12. An output method for outputting first and second well bias voltages according to claim 11, further comprising:

outputting the first signal when the first logical threshold voltage is higher than the second logical threshold voltage, and outputting the second signal when the first logical threshold voltage is lower than the third logical threshold voltage.

13. An output method for outputting first and second well bias voltages according to claim 8, further comprising:

adjusting the second control signal using the difference signal in comparison to the first control signal by using a table lookup method.

14. An output method for outputting first and second well bias voltages according to claim 8, further comprising:

simulating a delay time in a critical path comprising the first MOS transistor and the second MOS transistor by a path comprising the third MOS transistor and the fourth MOS transistor, and outputting the delay signal from the delay monitor circuit by simulating the delay time.

* * * * *

UNITED STATES PATENT AND TRADEMARK OFFICE
CERTIFICATE OF CORRECTION

PATENT NO. : 6,847,252 B1
DATED : January 25, 2005
INVENTOR(S) : Ono et al.

It is certified that error appears in the above-identified patent and that said Letters Patent is hereby corrected as shown below:

Title page,
Item [54], Title, delete "SEMICONDUCTOR INTEGRATED CIRCUIT DEVICE" and insert -- WELL BIAS VOLTAGE CONTROL CIRCUIT AND METHOD --

Signed and Sealed this

Twenty-eighth Day of June, 2005

JON W. DUDAS
*Director of the United States Patent and Trademark Office*